(12) United States Patent
Chung et al.

(10) Patent No.: US 6,774,051 B2
(45) Date of Patent: Aug. 10, 2004

(54) METHOD FOR REDUCING PITCH

(75) Inventors: Chia-Chi Chung, Hsinchu (TW); Henry Chung, Hsinchu (TW); Ming-Chung Liang, Hsinchu (TW); Jerry Lai, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/170,309

(22) Filed: Jun. 12, 2002

(65) Prior Publication Data

US 2003/0232509 A1 Dec. 18, 2003

(51) Int. Cl.[7] .............................................. H01L 21/31
(52) U.S. Cl. ...................................... 438/778; 438/758
(58) Field of Search ............................. 438/778, 695, 438/780

(56) References Cited

U.S. PATENT DOCUMENTS

| | | | | |
|---|---|---|---|---|
| 4,842,677 A | * | 6/1989 | Wojnarowski et al. | 216/65 |
| 6,337,264 B2 | * | 1/2002 | Bhakta | 438/585 |
| 6,399,483 B1 | * | 6/2002 | Liu et al. | 438/638 |
| 6,458,385 B2 | * | 10/2002 | Jamiolkowski et al. | 424/486 |
| 6,475,892 B1 | * | 11/2002 | Bhakta | 438/585 |
| 6,548,385 B1 | * | 4/2003 | Lai | 438/552 |
| 2003/0082916 A1 | * | 5/2003 | Chung et al. | 438/694 |

* cited by examiner

*Primary Examiner*—David Nelms
*Assistant Examiner*—Thao P. Le
(74) *Attorney, Agent, or Firm*—Stout, Uxa, Buyan & Mullins, LLP

(57) ABSTRACT

A method is disclosed for forming a semiconductor structure with conductive features having reduced dimensional spacing or pitch. First polymer layers are formed over photoresist features to facilitate patterning of both an underlying first dielectric and conductive layer into first dielectric features and conductive features. Second dielectric features are then formed in spaces between the first dielectric and between the conductive features, followed by the first dielectric features being removed. Second polymer layers are then formed over the second dielectric features, such that portions of the second polymer layers cover corresponding portions of the conductive features that are adjacent to the second dielectric features. Subsequently, the second polymer layers are used to pattern the conductive features, to thereby remove portions of the conductive features that are not covered by the polymer layers and define second conductive features. The first and second polymer layers can be formed using dielectric resolution enhancement coating techniques.

24 Claims, 5 Drawing Sheets

METHOD FOR REDUCING PITCH

RELATED APPLICATION INFORMATION

This patent application is related to a co-pending application Ser. No. 09/978,546 entitled "Method for Reducing Dimensions Between Patterns on a Photoresist" by Henry Wei-Ming Chung, Shin-Yi Tsai and Ming-Chung Liang, filed Oct. 18, 2001, which is commonly assigned and the entire contents of which are expressly incorporated herein by reference to the extent compatible and not mutually exclusive.

BACKGROUND OF THE INVENTION

1. Field of the Invention

The present invention relates generally to semiconductor fabrication methods, and more particularly to methods for reducing spacing dimensions or pitch between conductive features.

2. Description of Related Art

Integrated circuits are currently in widespread use in nearly all types of electronic equipment, ranging from household goods and appliances to computer networking and sophisticated supercomputers. Electronic devices such as resistors, capacitors, transistors, etc., are typically fabricated on semiconductor wafers (e.g., silicon wafers) using photolithographic processes. Such photolithographic processes commonly involve the formation of various layers of desired materials via oxidation or deposition operations, the patterning of layers via removal operations such as wet etches, reactive ion etches, etc., and material modification operations such as doping operations and heat treatments.

A common objective among photolithographic techniques is to reduce or control critical dimensions of features, while maintaining precision. For instance, the dimensional spacing or pitch between adjacent devices, required for device isolation to avoid short circuit conditions and signal cross talk, can contribute significantly to increases in overall dimensions of integrated circuits. Thus, as integrated circuits become smaller and denser, the need to reduce spacing dimensions or pitch, becomes increasingly important.

Limits on minimum device spacing typically stem from limits inherent in the photolithographic process itself. In the prior art, devices are generally arranged as close to one another as the limits of the photolithographic processes will permit. The number and order of operations in a given photolithographic process may also affect the resulting spacing of circuit devices on semiconductor wafers. An ongoing need exists to reduce the size of integrated circuits by reducing the spacing dimensions or pitches between adjacent devices fabricated on semiconductor wafers via photolithographic processes.

SUMMARY OF THE INVENTION

A method is disclosed for forming a semiconductor structure with conductive features having reduced dimensional spacings or pitch. In one embodiment, a substrate having a conductive layer formed thereon is provided. A first or cap dielectric layer is formed on the conductive layer. At least one, and preferably multiple, photoresist features are formed on the first dielectric layer. First polymer layers are formed over exposed surfaces of each of the photoresist features. The first polymer layers are used to pattern the first dielectric layer and the conductive layer, thereby forming a plurality of first dielectric and conductive features. The plurality of first dielectric and conductive features may comprise: (a) at least one dielectric feature and a plurality of conductive features; (b) a plurality of dielectric features and at least one conductive feature; or (c) a plurality of dielectric features and a plurality of conductive features.

The first polymer layers and the photoresist features are removed. Subsequently, a second dielectric layer is formed over and about the dielectric features and portions of the underlying conductive features. An upper portion of the second dielectric layer is removed such that an upper surface of the second dielectric layer is substantially even with (i.e., flush with) upper surfaces of the first dielectric features. The first dielectric features are then removed, whereby the second dielectric layer is thus formed into second dielectric features.

A second polymer layer is formed over remaining portions of the second dielectric layer (i.e., the second dielectric features), and over portions of an upper surface of each of the conductive features adjacent to corresponding remaining portions of the second dielectric layer. The second polymer layers are used to pattern the conductive features, thereby removing for example central portions of each of the conductive features and producing second conductive features. The second polymer layers and the remaining portions of the second dielectric layer are subsequently removed.

The resulting semiconductor structure includes the substrate and a number of second conductive features, which may be for example twice the original number of conductive features. The second conductive features have reduced dimensional spacing or pitch with regard to the original conductive features.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF THE PRESENTLY PREFERRED EMBODIMENTS

Figure 1:
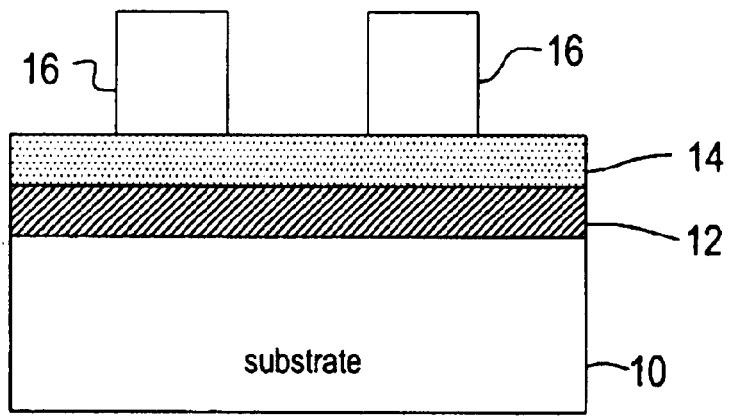
FIG. 1 is a cross-sectional view of a multilayered stack including a conductive layer formed on a substrate, a cap dielectric layer formed on the conductive layer, and a pair of photoresist features formed on the cap dielectric layer.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims.

It is to be understood and appreciated that the process steps and structures described herein do not cover a complete process flow for the manufacture of a reduced pitch circuit component on a semiconductor wafer. The present invention may be practiced in conjunction with various integrated circuit fabrication techniques that are conventionally used in the art, and only so much of the commonly practiced process stages are included herein as are necessary to provide an understanding of the present invention.

Referring to the drawings, FIG. 1 is a cross-sectional view of a multilayered stack structure including a substrate 10 (e.g., a silicon substrate) having a conductive layer 12 formed thereon, and a cap dielectric layer 14 formed on the conductive layer 12. Although the substrate 10 preferably comprises a silicon substrate, in alternative embodiments the substrate 10 can comprise materials such as gallium nitride (GaN), gallium arsenide (GaAs), or other materials commonly recognized as suitable semiconductor materials to those skilled in the art. The conductive layer 12 may be, for example, a polysilicon layer, and the cap dielectric layer 14 may be, for example, a silicon nitride layer. The conductive layer 12 may be formed by chemical vapor deposition (CVD) methods including low pressure chemical vapor deposition; and the cap dielectric layer 14 may be grown, or deposited using CVD methods including plasma-enhanced CVD and low pressure CVD methods.

A pair of photoresist features 16 are formed on the dielectric layer 14. The photoresist features 16 may be formed, for example, by patterning a photoresist layer. As is common in the art, the layer of photoresist is first spun onto the wafer. The wafer is then placed into a stepper (photolithography tool for patterning wafers) where it is aligned to a mask and exposed to ultraviolet (UV) radiation. The mask may only be large enough to cover a small portion of the wafer, in which case the stepper steps the wafer through many quadrants, each of them being exposed in turn, until the entire or desired portion of wafer has been exposed to UV light. The wafer is then placed into a chemical bath that dissolves the photoresist which was exposed to the UV radiation, to thereby yield a patterned photoresist layer comprising the photoresist features 16. An exemplary spacing between the photoresist features 16, using a conventional photolithographic process and a wavelength of about 248 nm, can be about 0.13 um to about 0.15 um.

Figure 2:
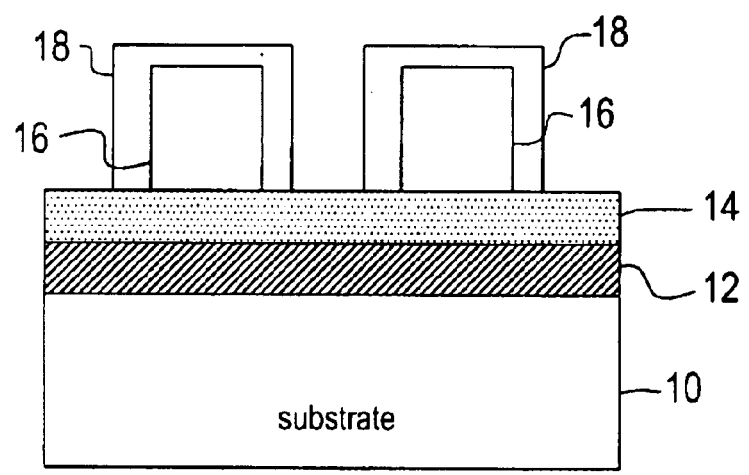
FIG. 2 is a cross-sectional view of the multilayered stack of FIG. 1, wherein first polymer layers have been formed over exposed surfaces of each of the photoresist features.

Turning to FIG. 2, a polymer layer 18 has been formed over exposed surfaces of each of the photoresist layers 16. In a preferred embodiment, the polymer layers 18 are formed using a dielectric resolution enhancement coating technique performed in an etcher. The polymer layers 18 can be formed using, for example, the methods and apparatus disclosed in co-pending U.S. application Ser. No. 09/978, 546, in whole or in part. In the illustrated embodiment, the polymer layers 18 comprise carbon fluoride and are formed to a top thickness of 0 to about 500 nm and a side thickness of about 30 nm to about 70 nm. Although the top thickness and the side thickness can be varied relative to one another, they are formed to be about the same in one embodiment. Regarding formation of the polymer layers 18, an etcher can be utilized in combination with a recipe for controlling the deposition/etching ratio in reaction so as to form the polymer on the side walls and top walls of the photoresist layers 16. The reactive gas used in the reaction is preferably one unable to react with the underlayer such as dielectric layer 14 or the conductive layer 12.

Figure 3:
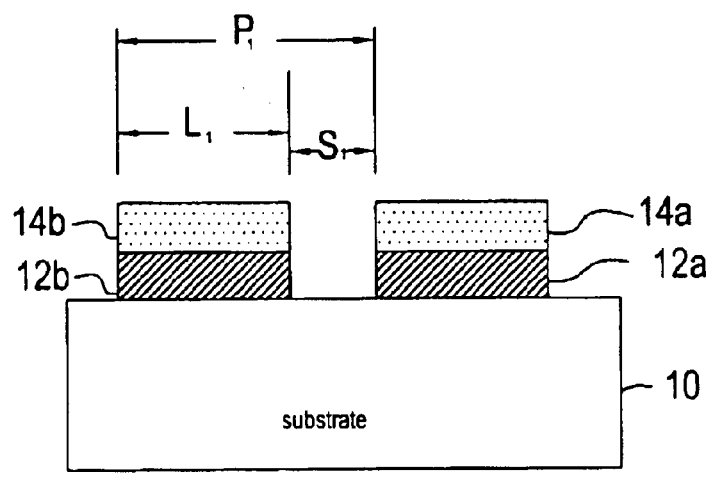
FIG. 3 is a cross-sectional view of the multilayered stack of FIG. 2, wherein the cap dielectric layer and the conductive layer have been patterned using the first polymer layers to form dielectric features and underlying conductive features, and the photoresist features and polymer layers have been removed.

In FIG. 3, the conductive layer 12 and the cap dielectric layer 14 of FIG. 1 have been patterned using the polymer layers 18 to form a plurality of conductive features 12a and 12b, and a plurality of dielectric features 14a and 14b. In the illustrated embodiment, the plurality of conductive features 12a and 12b are arranged in an alternating fashion with the plurality of dielectric features 14a and 14b. The polymer layers 18 over the photoresist layers 16 act as etch masks to substantially preserve the underlying portions of the conductive layer 12 and the cap dielectric layer 14. After the patterning of the conductive layer 12 and the dielectric layer 14, the polymer layers 18 and the photoresist layers 16 are removed. This removal may be accomplished, for example, by using ashing and/or solvents to dissolve, and flush away, the polymer layers 18 and photoresist layers 16. Other known and suitable removal techniques may also be used to remove the polymer layers 18 and the photoresist layers 16.

The term "pitch" as used herein refers to a distance between one edge of a feature, such as conductive feature 12a, and a corresponding edge of an adjacent feature, such as conductive feature 12b. The pitch between conductive features 12a and 12b is labeled "P1" in FIG. 3. The pitch P1 in one embodiment is as small as the process used to form the conductive features 12a and 12b will allow." A dimension labeled "L1" in FIG. 3 represents a width of each of the conductive features 12a and 12b in FIG. 3. The conductive features 12a and 12b are separated by a dimension labeled "S1," which as presently embodied is less than the L1 dimension. It can be seen from FIGS. 2 and 3 that the S1 dimension is equal to a distance between two of the photoresist features 16 minus the thicknesses of the polymer layers 18 on the sidewalls of the photoresist features 16. As elucidated in FIG. 3, the pitch dimension P1 is equal to the sum of the L1 and S1 dimensions.

Figure 4:
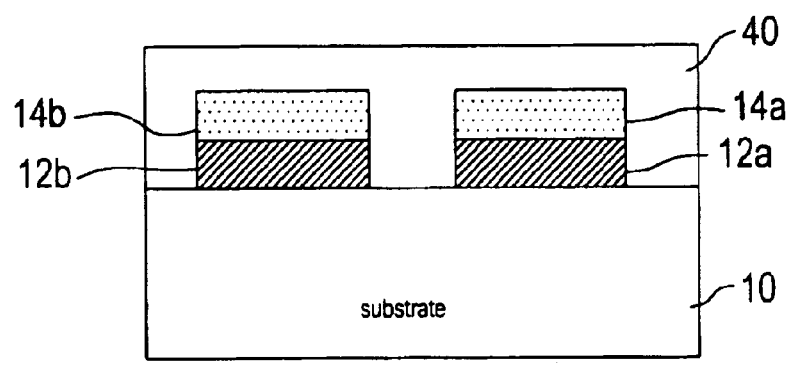
FIG. 4 is a cross-sectional view of the multilayered stack of FIG. 3, wherein a second dielectric layer is disposed on and about the dielectric features.

Turning to FIG. 4, a second dielectric layer 40 is disposed on exposed portions of the substrate 10, and over the conductive features 12a and 12b and the corresponding dielectric features 14a and 14b. The second dielectric layer 40 may be, for example, a silicon dioxide (i.e., oxide) and/or a spin-on glass (SOG) layer. In the illustrated embodiment, the SOG comprises a SOG-oxide layer including for example a mixture of silicates, phosphosilicates and/or siloxanes in a solvent that evaporates quickly. After spin application, the SOG layer is heated (i.e. baked), resulting in a SOG-oxide dielectric layer.

Figure 5:
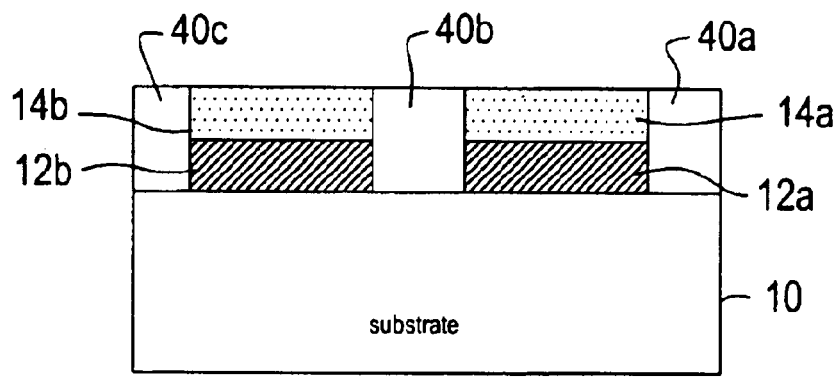
FIG. 5 is a cross-sectional view of the multilayered stack of FIG. 4, wherein an upper portion of the second dielectric layer is removed such that upper surfaces of remaining portions of the second dielectric layer are even with upper surfaces of the dielectric features.

As reflected in FIG. 5, the second dielectric layer 40 is planarized until upper surfaces of remaining portions 40a, 40b, and 40c of the second dielectric layer 40 are even with (i.e., flush with) upper surfaces of the dielectric features 14a and 14b. In a preferred embodiment, the second dielectric layer 40 is removed until the dielectric features 14a and 14b are exposed. For instance, the second dielectric layer 40 can be a SOG-oxide layer, which is planarized using a chemical-mechanical polishing (CMP) or an etch back technique. As known to those having skill in the semiconductor processing art, CMP is an abrasive process performed on for example oxides and metals that is used to polish the surface of the wafer flat. Chemical slurries can be used along with a circular "sanding" action to create a smooth polished surface. This smooth surface may be necessary, for example, to maintain a proper depth of focus for subsequent steps in a stepper, and in the instant application can help to ensure that the resulting polymer layers are properly formed. Alternately, the second dielectric layer 40 may be planarized using an etch-back process.

Figure 6:
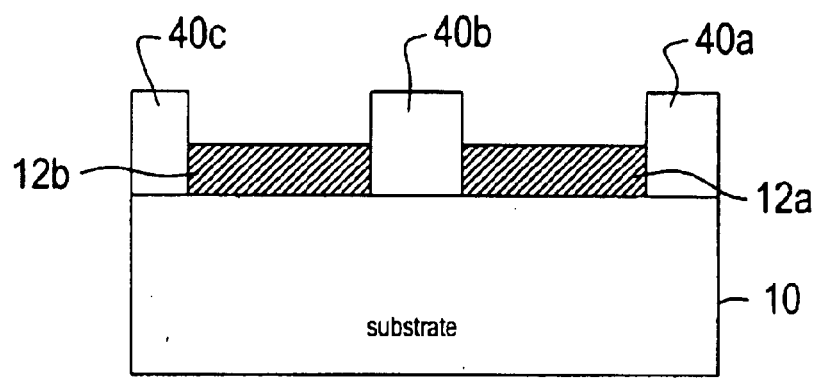
FIG. 6 is a cross-sectional view of the multilayered stack of FIG. 5, wherein the dielectric features have been removed.

As reflected in FIG. 6, the dielectric features 14a and 14b are removed, exposing upper surfaces of the conductive features 12a and 12b. In a preferred embodiment, the dielectric features 14a and 14b are removed via a selective etch process that removes a substantial amount (e.g., all) of the material of the dielectric features 14a and 14b, and does not remove a substantial amount of the material of the remaining portions 40a, 40b, and 40c of the second dielectric layer 40.

Figure 7:
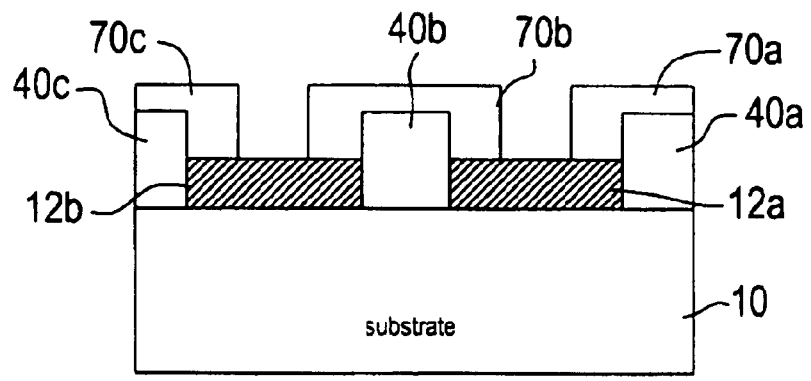
FIG. 7 is a cross-sectional view of the multilayered stack of FIG. 6, wherein a second polymer layer has been formed on the remaining exposed portions of the second dielectric layer.
Figure 8:
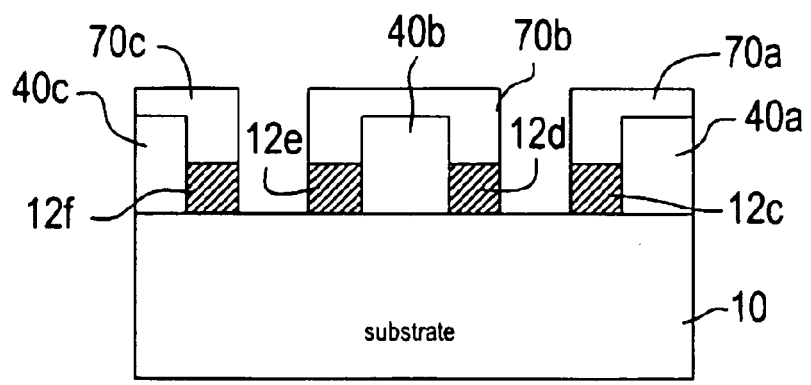
FIG. 8 is a cross-sectional view of the multilayered stack of FIG. 7, wherein the second polymer layers have been used to pattern the conductive features such that central portions of the conductive features have been removed to form second conductive features.

As shown in FIG. 7, a set of second polymer layers 70a, 70b and 70c is formed on the remaining portions 40a, 40b, and 40c of the second dielectric layer 40, respectively, and over portions of the conductive features 12a and 12b adjacent to the remaining portions 40a, 40b, and 40c of the second dielectric layer 40. In a preferred embodiment, the polymer layers 70a, 70b and 70c are formed using the above-described dielectric resolution enhancement coating technique that is performed in an etcher. As reflected in FIG. 8, the polymer layers 70a, 70b and 70c are used to pattern the conductive features 12a and 12b such that exposed portions (e.g., central portions) of the conductive features 12a and 12b are removed. As use herein, the term "central portion" refers to a portion not covered by polymer layers, and does not necessarily mean a "middle portion." The polymer layers 70a, 70b and 70c act as etch masks and substantially preserve the respective areas of the conductive features 12a and 12b that lie beneath each polymer layer. As a result, second conductive features, labeled 12c, 12d, 12e, and 12f in FIG. 8, are formed from the conductive features 12a and 12b. The second conductive features 12c and 12d are formed by removing a central portion of the conductive feature 12a (FIGS. 3–7), and the second conductive features 12e and 12f are formed by removing a central portion of the conductive feature 12b (FIGS. 3–7).

In accordance with one aspect of the invention, polymer layers (e.g., 70a and 70b) are formed over a plurality of dielectric features (e.g., 40a and 40b), such that portions of the polymer layers cover portions of at least one conductive feature (e.g. 12a) that are adjacent to the plurality of dielectric features. Following this construction, which is exemplified in FIG. 7, the polymer layers are used to pattern the at least one conductive feature, to thereby remove portions of the at least one conductive feature that are not covered by the polymer layers and define a plurality of second conductive features (e.g., 12c and 12d), as exemplified in FIG. 8.

In accordance with another aspect of the invention, at least one polymer layer (e.g., 70b) is formed over at least one dielectric feature (e.g., 40b), such that portions of the at least one polymer layer cover portions of a plurality of conductive features (e.g., 12a and 12b) that are adjacent to the at least one dielectric feature. The at least one polymer layer is then used as a mask to pattern the plurality of conductive features, to thereby remove portions of the plurality of conductive features that are not covered by the at least one polymer layer.

In the illustrated embodiment, surface areas of the exposed portions that are removed are about the same size as surface areas of the covered portions that remain. In other words, the polymer layers 70a, 70b and 70c are formed over the sidewalls of the dielectric features 40a, 40b and 40c at thicknesses which are about equal to the widths of the second conductive features 12c, 12d, 12e and 12f. In modified embodiments, additional polymer layers (and corresponding underlying portions of the second dielectric layer) may be formed adjacent to each of the conductive features, to thereby form greater numbers of second conductive features. For instance, as distinguished from the two polymer layers 70a and 70b being formed at, for example, 0 degrees and 180 degrees around the conductive feature 12a (FIG. 7), three polymer layers can be formed (over three corresponding portions of the second dielectric layer) at, for example, 0 degrees, 120 degrees, and 240 degrees around the conductive feature 12a (FIG. 7).

Figure 9:
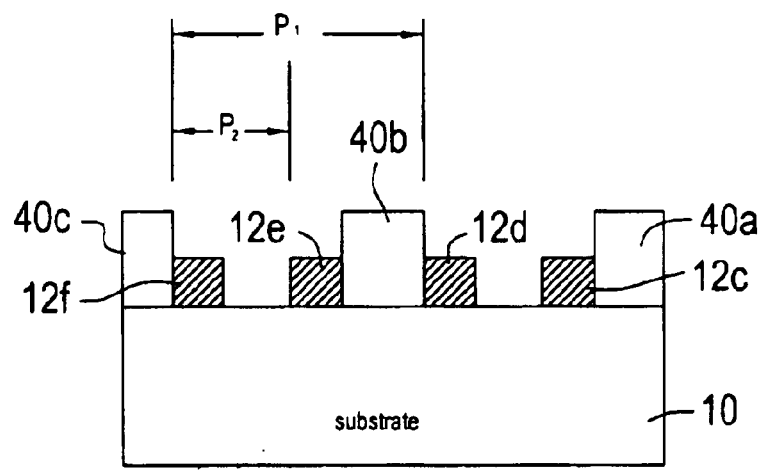
FIG. 9 is a cross-sectional view of a multilayered stack of FIG. 8, wherein the second polymer layers have been removed.

As indicated in FIG. 9, the polymer layers 70a, 70b and 70c are removed. For example, a solvent may be used to dissolve, and flush away the polymer layers 70a, 70b and 70c. Other known and suitable removal techniques may also be used to remove the polymer layers 70a, 70b and 70c.

Figure 10:
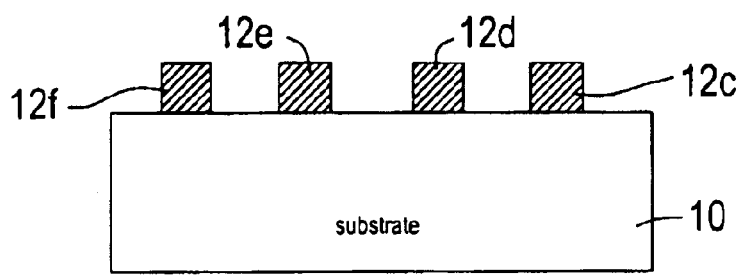
FIG. 10 is a cross-sectional view of a multilayered stack of FIG. 9, wherein the remaining portions of the second dielectric layer have been removed.

As reflected in FIG. 10, the remaining portions 40a, 40b, and 40c of the second dielectric layer 40 are removed (e.g., via a wet or dry etch technique). The resulting structure includes the substrate 10 having the second conductive features 12c, 12d, 12e, and 12f thereon. In the illustrated embodiment, the second conductive features 12c, 12d, 12e, and 12f are substantially equally spaced from one another. To achieve such spacings, the surface areas of the remaining portions 40a, 40b, and 40c, which can be varied inter alia by adjusting the thicknesses of the first polymer layers 18, are set in the illustrated embodiment to be about the same as the conductive feature 12a and 12b exposed surface areas (FIG. 7), which can be varied inter alia by adjusting the thicknesses of the second polymer layers 70a, 70b and 70c. For example, a distance between the second conductive features 12d and 12e can be set for example by controlling the thicknesses of the first polymer layers 18, and a distance between the second conductive features 12c and 12d can be set for example by controlling the thicknesses of the second polymer layers 70a and 70b. In addition to spacings, the sizes (e.g., surface areas) of the second conductive layers 12c, 12d, 12e, and 12f, may be changed by varying the thicknesses of the polymer layers 18, 70a, 70b, and 70c. Other spacings, sizes, and distributions may be set in relation to the conductive features 12c, 12d, 12e, and 12f by, for example, implementing various combinations and modifications of the above-described adjustments.

Referring back to FIG. 9, a new pitch labeled "P2" has been created between the second conductive features 12c, 12d, 12e, and 12f as the result of the above process, wherein the pitch P2 is much smaller than the pitch P1 in FIG. 3. In other words, the pitch P2 of the second conductive features 12c, 12d, 12e, and 12f has been reduced over the pitch P1 of the conductive features 12a and 12b of FIG. 3. For example, in the illustrated example the pitch P2 is about one half of the pitch P1. Further, the above described method is readily adaptable to many photolithographic process. The reduced pitches between conductive features can allow the density of integrated circuitry formed on a semiconductor wafer to be increased.

In another embodiment of the above described method, the dielectric layer 14 is a silicon-oxide layer, and the second dielectric layer 40 is a silicon nitride layer The resulting structure is substantially the same, with the substrate 10 having the second conductive features 12c, 12d, 12e, and 12f disposed thereon. Thus, the cap dielectric layer 14 and the second dielectric layer 40 are formed of different materials, so that the cap dielectric layer 14 can be removed (i.e., etched) selectively with respect to the second dielectric layer 40.

It should be noted that the above described methods and structures can be used to form any of several different types of devices, including metal oxide semiconductor (MOS) devices, and those devices may be used to form memory structures such as read only memory (ROM) structures and random access memory (RAM) structures.

In view of the foregoing, it will be understood by those skilled in the art that the methods of the present invention can facilitate formation and fabrication of reduced pitch circuit component on a semiconductor wafer. The above-described embodiments have been provided by way of example, and the present invention is not limited to these examples. For example, while the above embodiments have been illustrated in the context of reducing pitch of conductive features, similar applications may be implemented to reduce pitches of features formed of other materials. Multiple other variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A method for reducing pitch in semiconductor fabrication, comprising:
   providing a semiconductor substrate having at least one conductive feature arranged adjacent to a plurality of dielectric features;
   forming polymer layers over the plurality of dielectric features, such that portions of the polymer layers cover portions of the at least one conductive feature that are adjacent to the plurality of dielectric features; and
   using the polymer layers to pattern the at least one conductive feature, to thereby remove portions of the at least one conductive feature that are not covered by the polymer layers and define a plurality of second conductive features.

2. The method as set forth in claim 1, wherein:
   the at least one conductive feature comprises a plurality of conductive features.

3. The method as set forth in claim 2, wherein conductive features of the plurality of conductive features are arranged on the semiconductor substrate in an alternating fashion with members of the plurality of dielectric features.

4. The method as set forth in claim 3, wherein a surface area of a removed portion of a conductive feature is about the same size as a surface area of a member of the plurality of second conductive features.

5. The method as set forth in claim 4, wherein:
   patterning of the plurality of conductive features yields a number of second conductive features that is at least twice a number of the conductive features; and
   the method further comprises removing the polymer layers.

6. The method as set forth in claim 2, wherein the polymer layers comprise second polymer layers, wherein the dielectric features comprise second dielectric features, and wherein the providing of a semiconductor substrate comprises:
   (a) providing a substrate having a conductive layer formed thereon;
   (b) forming a first dielectric layer on the conductive layer;
   (c) disposing a plurality of photoresist features on the first dielectric layer;
   (d) forming first polymer layers over exposed surfaces of each of the photoresist features;
   (e) using the first polymer layers to pattern the first dielectric layer and the conductive layer, thereby forming a plurality of first dielectric features disposed above the plurality of conductive features;
   (f) removing the first polymer layers and the photoresist features;
   (g) disposing a second dielectric layer over and about the first dielectric features and the conductive features;
   (h) removing an upper portion of the second dielectric layer such that an upper surface of the second dielectric layer is substantially flush with an upper surface of each of the first dielectric features; and
   (i) removing the first dielectric features to thereby form the second dielectric layer into the plurality of second dielectric features.

7. The method as set forth in claim 6, and further comprising removing the second polymer layers from the second conductive features and removing the second dielectric features.

8. A semiconductor structure formed using the method of claim 7.

9. The structure as set forth in claim 8, wherein a pitch of the second conductive features is less than a pitch which can be generated using steps (a) through (e).

10. The method as set forth in claim 6, wherein:
    the conductive layer comprises polysilicon;
    the photoresist features are arranged according to a predetermined pattern;
    the first dielectric features are removed using a selective etch procedure; and
    the first polymer layers and the second polymer layers are formed using a dielectric resolution enhancement coating technique.

11. The method as set forth in claim 10, wherein the second dielectric layer is formed using a spin on glass (SOG) process.

12. The method as set forth in claim 6, wherein the first dielectric layer comprises silicon nitride, and the second dielectric layer comprises silicon dioxide.

13. The method as set forth in claim 6, wherein the first dielectric layer comprises silicon dioxide, and the second dielectric layer comprises silicon nitride.

14. The method as set forth in claim 6, wherein the removing of the upper portion of the second dielectric layer is carried out using a planarization technique.

15. The method as set forth in claim 6, wherein:

the photoresist features have sidewalls; and the first polymer layers are formed on two sidewalls of two corresponding photoresist features at predetermined thicknesses, wherein a distance between two of the first dielectric features is equal to a distance between the two photoresist features minus the thicknesses of the first polymer layers on the two sidewalls.

16. The method as set forth in claim 2, wherein:

the dielectric features have sidewalls;

the second conductive features have widths; and the polymer layers are formed over the sidewalls of the dielectric features at thicknesses which are about equal to the widths of the second conductive features.

17. A method for reducing pitch in semiconductor fabrication, comprising:

providing a semiconductor substrate having a plurality of conductive features arranged adjacent to at least one dielectric feature;

forming at least one polymer layer over the at least one dielectric feature, such that portions of the at least one polymer layer cover portions of the plurality of conductive features that are adjacent to the at least one dielectric feature; and using the at least one polymer layer to pattern the plurality of conductive features, to thereby remove portions of the plurality of conductive features that are not covered by the at least one polymer layer.

18. The method as set forth in claim 17, wherein the patterning is followed by removing the at least one polymer layer and the at least one dielectric feature.

19. The method as set forth in claim 17, wherein the at least one dielectric feature comprises a plurality of dielectric features and the at least one polymer layer comprises a plurality of polymer layers.

20. The method as set forth in claim 19, wherein top surfaces of the dielectric features are disposed further from the substrate than top surfaces of the conductive features.

21. The method as set forth in claim 19, wherein:

the polymer layers are used as an etch mask for patterning the plurality of conductive features into a plurality of second conductive features; and the polymer layers are formed using a dielectric resolution enhancement coating technique.

22. The method as set forth in claim 21, wherein the polymer layers comprise second polymer layers, wherein the dielectric features comprise second dielectric features, and wherein the providing of a semiconductor substrate comprises:

(a) providing a substrate having a first dielectric layer, a conductive layer, and a plurality of photoresist features on the first dielectric layer;

(b) forming first polymer layers over exposed surfaces of each of the photoresist features;

(c) using the first polymer layers to pattern the first dielectric layer and the conductive layer, thereby forming a plurality of first dielectric features disposed above the plurality of conductive features;

(d) removing the first polymer layers and the photoresist features;

(e) disposing a second dielectric layer over and about the first dielectric features and the conductive features;

(f) removing an upper portion of the second dielectric layer such that an upper surface of the second dielectric layer is substantially flush with an upper surface of each of the first dielectric features; and (g) removing the first dielectric features to thereby form the second dielectric layer into the plurality of second dielectric features.

23. The method as set forth in claim 21, wherein the conductive features comprise polysilicon.

24. The method as set forth in claim 21, wherein the second dielectric features comprise spin-on glass.

* * * * *